United States Patent [19]

Napiorkowski et al.

[11] 4,319,300

[45] Mar. 9, 1982

[54] SURGE ARRESTER ASSEMBLY

[75] Inventors: John Napiorkowski, Massapequa Park, N.Y.; Raymond D. Jones, Cheam, England; Toshitaka Fukushima, Yokohama; Kazumi Koyama, Kanagawa; Kouji Ueno, Kawasaki; Tamio Miyamura, Kawasaki; Yuichi Kawabata, Kawasaki, all of Japan

[73] Assignees: TII Industries, Inc., Lindenhurst, N.Y.; Fujitsu Limited, Kawasaki, Japan

[21] Appl. No.: 93,236

[22] Filed: Nov. 13, 1979

[51] Int. Cl.[3] ........................ H02H 9/06; G11C 7/00; G11C 17/00

[52] U.S. Cl. .................................... 361/119; 361/120; 365/96

[58] Field of Search ............... 361/117, 119, 120, 124, 361/129; 365/94, 96, 104, 105

[56] References Cited

U.S. PATENT DOCUMENTS

| | | | |
|---|---|---|---|
| 3,254,179 | 5/1966 | Howard . | |
| 3,281,625 | 10/1966 | Wanaselja . | |
| 3,340,431 | 9/1967 | Wanaselja . | |
| 3,522,570 | 8/1970 | Wanaselja . | |
| 3,569,786 | 3/1971 | Kunugi . | |
| 3,611,319 | 10/1971 | Hyatt | 365/96 |
| 3,703,665 | 11/1972 | Yereance et al. . | |
| 3,755,715 | 8/1973 | Klayum et al. | 361/124 X |
| 3,896,343 | 7/1975 | Baker et al. . | |
| 4,002,952 | 1/1977 | Meanings . | |
| 4,062,054 | 12/1977 | Simokat | 361/124 X |
| 4,101,974 | 7/1978 | Immer et al. | 365/96 |
| 4,130,889 | 12/1978 | Chua | 365/105 |

OTHER PUBLICATIONS

Radcliffe, "Fusable Diode Array Circuits", IBM Tech. Disc. Bul., vol. 21, No. 1, Jun. 1978, pp. 105–108.

*Primary Examiner*—Harry E. Moose, Jr.

*Attorney, Agent, or Firm*—Morgan, Finnegan, Pine, Foley & Lee

[57] ABSTRACT

A screw-in station protector assembly includes a carrier housing containing a shorting cage which is biased by a compression to urge the cage and gas tube arrester assembly outwardly. The gas tube assembly contained within the cage includes a two electrode gas tube. The gas tube is within a jacket which forms a sealed external back-up air gap protector. The screw-in-assembly is particularly adapted for retro-fitting/replacement of carbon block arresters without modification.

11 Claims, 12 Drawing Figures

SURGE ARRESTER ASSEMBLY

CROSS-REFERENCE TO RELATED APPLICATIONS

The application is related to Applications Ser. No. 719,077, filed Aug. 31, 1976; Ser. No. 843,320 filed Oct. 19, 1977; Ser. No. 18,360 filed Mar. 6, 1979, the disclosures of which are incorporated herein.

BACKGROUND

Gas tube overvoltage protectors are widely used for the protection of equipment from overvoltage conditions which may be caused by lightning, high voltage line contact, and the like.

It is also a widely practiced technique to associate various fail-safe arrangements with such tubes and with other types of protectors, e.g., air gap arresters, to meet various contingencies. For example, the presence of a sustained overload, as where a power line has come in continued contact with a protected telephone line, produces a concomitant sustained ionization of the gas tube and the resultant passage of heavy currents through the tube. Such currents will in many cases destroy the overvoltage protector and may also constitute a fire hazard.

One common approach to this problem is to employ fusible elements which fuse in the presence of such overloads and provide either a permanent short circuiting of the arrester directly, or function to release another mechanism, e.g., a spring loaded shorting member, which provides the short circuit connection (commonly, the arrester electrodes are both shorted and grounded). The presence of the permanent short and ground condition serves to flag attention to that condition thus signalling the need for its inspection or replacement. Examples of this type of fail-safe protection are found in U.S. Pat. Nos. 3,254,179; 3,281,625; 3,340,431; 3,896,343; and 3,522,570. Several of these patents also incorporate with the fail-safe feature, a backup air gap arrangement so that there is both fail-safe fusible (short) type screw-in or well type arresters are described in U.S. Pat. Nos. 3,703,665 and 3,755,715.

It has formerly been common practice to use gas tubes connected in parallel with conventional, separately mounted, carbon air gaps which break down at less than 1000 V, as back up protection so that in the event that the gas tube leaks and becomes operative at high voltages, usually in excess of 2500 V or more, the air gap will function to maintain the desired protection level.

Assemblies such as those in U.S. Pat. Nos. 3,569,786 and 4,002,952 covered arrangements for providing similar carbon air gaps connected in parallel with the gas tube, but mounted in a unitary screw in protection assembly. These arrangements suffer the well known disadvantages of the carbon air gap which include the development of low insulation resistance and noise conditions on the lines to which they are connected.

The arrangement of U.S. Pat. No. 3,755,715 includes a back-up air gap using metal electrodes in parallel with the gas tube. This arrangement suffers from the disadvantage that it is difficult in manufacture to control the air gap length within the close dimensional limits to ensure that the gap would breakdown at a voltage greater than that of the gas tube and yet breakdown at less than, say, 1000 V if the gas tube leaks.

The present invention seeks to provide an economic assembly which overcomes the disadvantages of the above arrangements and at the same time to provide a seal over the air gap to exclude dust, moisture and other contaminants.

SUMMARY OF THE INVENTION

The present invention is directed to a fail-safe surge arrester assembly in which improved surge and air-gap backup protection is provided. The invention is particularly adapted to up-grade existing systems.

Accordingly, the present invention may be summarized as follows: an electrical overvoltage arrester for protecting telephone and the like equipment from voltage surges transmitted by lines associating with such equipment, adapted to fit in a station protector housing having a pair of contacts one of which is threaded and which are separated by an insulator, a conductive holder, adapted and arranged to be threadably engaged in said station protector and into contact with one of the contacts; a conductive cage element within the holder and biased in a direction opposite said contact terminal; a gas tube subassembly and fusible alloy pellet contained within the cage including a gas filled housing having two electrodes; and an external air gap on the gas tube and interconnecting the electrodes thereof. The external air gap being formed by an end cap structure which extends from one electrode of the gas tube over the ceramic sleeve and means associated with the other electrode to define a controlled length air gap therebetween in an axial direction. The air gap is enclosed within an insulator layer.

DETAILED DESCRIPTION

Figure 1:
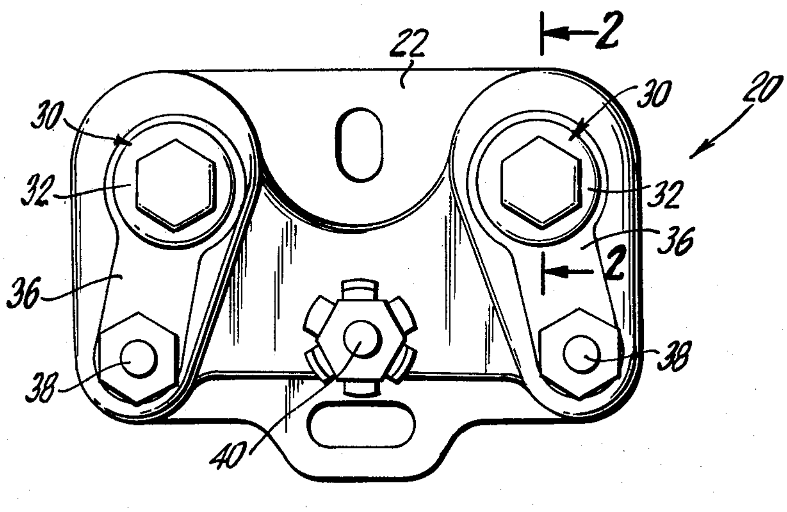
FIG. 1 is a top plan view of the surge arrestor assembly in accordance with the present invention.

While this invention is susceptible of embodiment in many different forms, there is shown in the drawings and will hereinafter be described in detail a preferred embodiment of the invention, and modifications thereto, with the understanding that the present disclosure is to be considered as an exemplification of the principles of the invention and is not intended to limit the invention to the embodiments illustrated.

Figure 2:
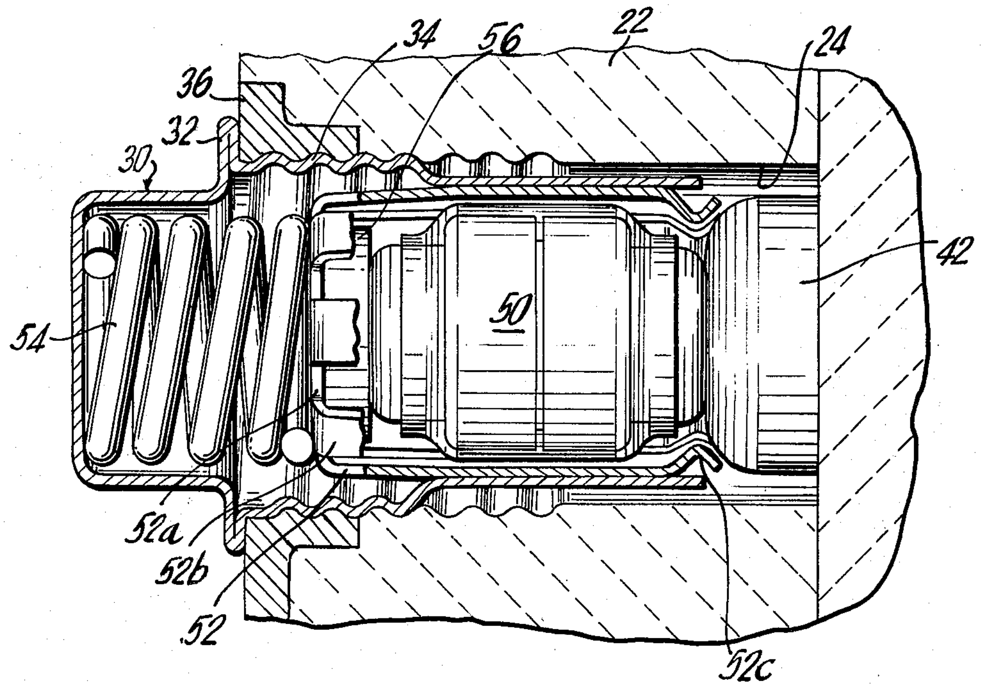
FIG. 2 is an enlarged partial cross-sectional view taken generally along line 2—2 in FIG. 1.

FIG. 1 shows a station protector assembly 20 which includes an insulating base member 22 having a pair of chambers 24 thereon for receiving externally threaded conductive holders 30. As best illustrated in FIG. 2, holder 30 includes a shoulder 32 just above threaded portion 34 so that the holder may be threadably engaged with the thread formed in bus conductor 36 and chamber 24 and drawn up with shoulder 32 bracing upon bus conductor 36. Each bus 36 is embedded in base 22 and provide electrical contact with stud 38.

A line wire of the circuit to be protected is connected to each stud 38. A ground wire is also connected to stud 40. Stud 40 is in electrical connection with a lower button contact 42 in each chamber 24.

Station protector assembly 20 is well known in the art of telephone protector and widely used. Typical example would be protector bases sold by Western Electric under designation 123A and 128AlA-1 which has two pairs of chambers 24.

A two-electrode gas tube surge arrester assembly 50 of the type described below is contained within the cylindrical portion of holder 30. More particularly, the assembly 50 is contained within a cage 52 which is biased by compression spring 54 toward contact 42 when the holder 30 is screwed into bus 36 and chamber 24.

Cage 52 includes a base portion 52A and a plurality of leg protrusions 52B extending in a generally cylindrical configuration about gas tube assembly 50. The end portions 52C of each leg 52B define radially inwardly directed contacts. The leg portions 52B are in sliding electrical contact with the interior surface of metal holder 30 so as to provide an electrical connection between the holder and one end electrode of the gas tube assembly 50. One cap or connection of the gas tube assembly 50 is maintained in electrical contact with base 52A by a fusible element 56. Other configurations for cage 52 which provide the features outlined may be used.

The installation of holder 30 in assembly 20 results in spring 54 biasing cage 52 toward contact 42, and maintains one electrode of gas tube assembly in electrical contact with the cage (and holder) and the other electrode in electrical connection with contact 42, thereby placing the gas tube assembly in series between the line contact 38 and ground 40.

Sustained overload of the gas tube assembly will result in the generation of heat, which causes fusible element 56 to melt. When fusible element 56 melts, cage 52 moves in the direction of and into electrical contact with bottom contact 42. Thus fail/safe short circuiting occurs between cage contacts 52C and contact 42 in known manner.

During normal operation, fusible element 56 maintains contact portions 52C in spaced relationship from contact 42 as illustrated in FIG. 2. The contacts are spaced a sufficient distance to prevent accidental arcing between them and contact 42.

Figure 3:
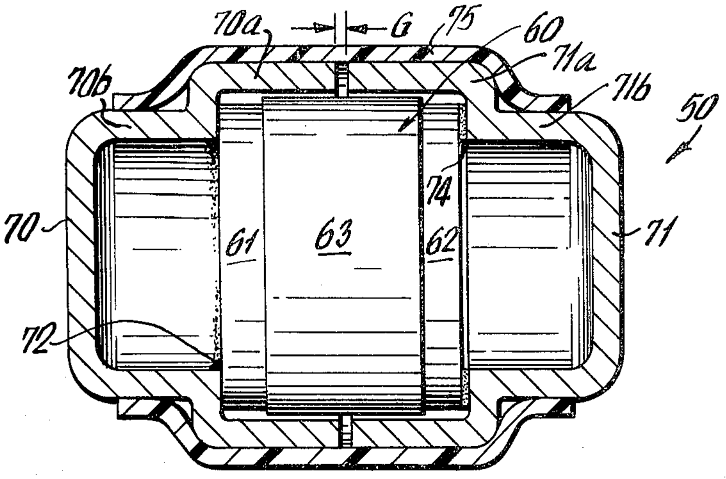
FIG. 3 is a longitudinal first cross-sectional view on an enlarged scale of a two-electrode gas tube assembly.

FIGS. 3–7A show various gas tube assemblies which may be used in cage 52. With particular reference to FIG. 3, assembly 50 includes a commercially available 2-electrode gas tube 60. Tube 60 includes a pair of end cap electrodes 61 and 62 which are joined to a ceramic cylinder 63. Such gas tubes are available from TII Corporation of Lindenhurst, N.Y. under designations Protector Type 38 or Ericsson F-type gas tubes. Other gas tubes which may be used are those sold under the designations TII Protector Type 37.

Assembly 50 includes a spark gap G which is formed between the peripheral edges of a pair of enclosure caps 70 and 71. Each cap includes a first-cylinder wall portion 70*a* and 71*a*, which receive the gas tube 60, a reduced diameter portion 70*b* and 71*b* and a generally circular end portion. The discharge gap G is defined by the space between the free ends of caps 70 and 71. Cap 70 may be affixed to electrode 61 by suitable means, e.g., braze 72. Cap 71 is attached to electrode 62 by means of braze 74.

Advantageously, the assembly 50 is fabricated as follows: Gas tube 60 is inserted into end cap 70, which has braze material positioned at the shoulder between the portions 70*a* and 70*b*. Shim of appropriate thickness to produce Gap G, e.g. 3 mil, are positioned at the free end of cap 70. Thereafter, cap 71 is positioned over electrode 62 with solder 74 carried on the shoulder between portion 71*a* and 71*b*. The two end caps 70 and 71 are pressed together to set the caps at the shim distance. The assembly is subjected to sufficient heating, as by RF heating, to melt the solder and join the end caps to the electrode. Where metal shims are used, they are removed after caps 70 and 71 have been secured in position. If insulating shims are used, they may be left in position.

Air gap G is enclosed within a sleeve 75 of heat-shrinkable non-metallic, electrically insulating material. Exemplary of such classes of materials are certain of the fluoroplastics, such as fluorinated ethylene propylene polymer (FEP) the polymer perfluoroalkoxy (PFA), the modified copolymer of ethylene and tetrafluoroethylene (ETFE) (marketed under the du Pont Company trademark Tefzel) and poly (ethylene-chlorotrifluoroethylene) (E-CTFE copolymer) marketed under the Allied Chemical Corporation mark Halfar, and a polyester plastic polyethylene terephthalate (marketed under the du Pont Company trademark Mylar).

Sleeve 75 is heat-shrunk into conformance with a general configuration of the assembly as shown in FIG. 3, for example by radiant or convective heating. Sleeve 75 functions to enclose gap G and insulate assembly 50 from cage 52. An adhesive/sealant may be included between sleeve 75 and surfaces of end caps 70 and 71.

Figure 4:
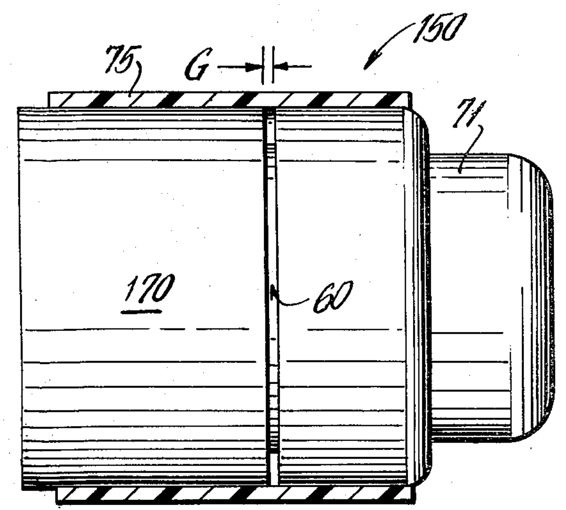
FIGS. 4–7 and 7A are longitudinal cross-sectional views of other two electrode gas tube assemblies.
Figure 5:
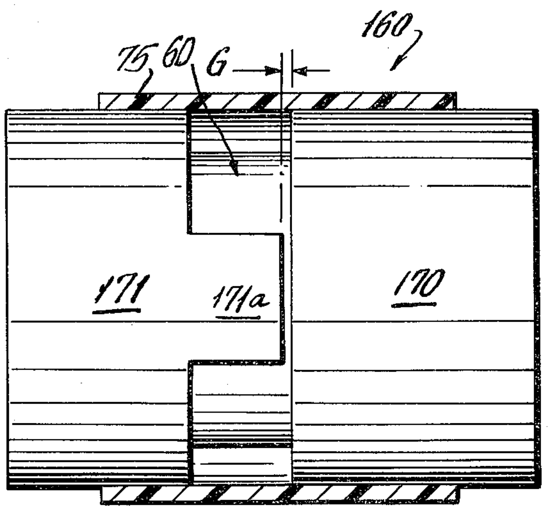

FIGS. 4 and 5 illustrate gas tube assemblies 150 and 160 with different end cap embodiments. Assembly 150 includes one end cap 71 of the type described with reference to FIG. 3 and a generally cylindrical shaped end cap 170. The end of cap 170 may be flat and circular in shape or other suitable shape. A gas tube of the type previously described is positioned within end caps 170 and 171 and in electrical contact with the associated end cap. A gap G is again provided between the facing edges of the end caps 170 and 171. A plastic sleeve 75 of the type described encloses the gap.

The assembly 160, FIG. 5, includes a gas tube 60 having a cylindrical end cap 170. The other end cap 171 is also cylindrical in shape but has a short wall height so that a substantial distance exists between the peripheral edges of the end caps, except for at least one shaped extension 171*a*. The leading edge of extension 171*a* defines the gap G with the edge of end cap 170. This structure facilitates the control of the gap distance. The gap is again enclosed within a sleeve 75.

Figure 6:
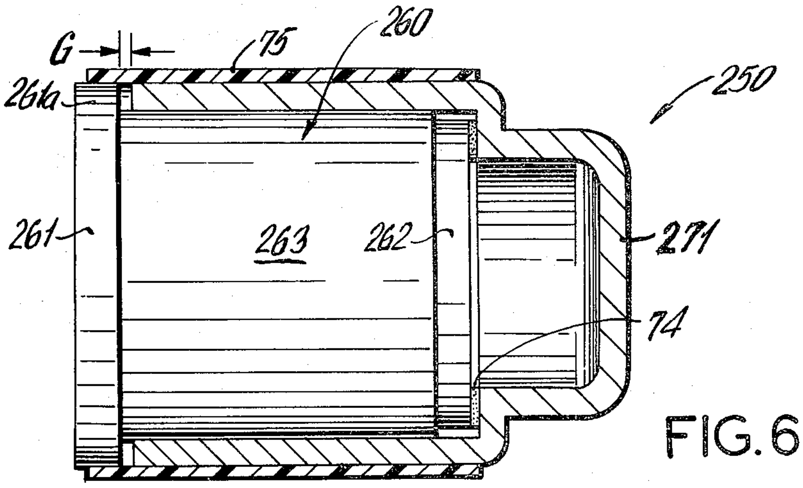

FIG. 6 shows still a further alternative gas tube assembly 250. The assembly includes a gas tube 260 having a ceramic sleeve 263 and two end electrodes 261 and 262. Tube 260 is similar to tube 60 except for end electrode 261, which has an enlarged annular portion 261*a* extending beyond the diameter of sleeve 263. Portion 261*a* forms a face for the air gap G. The other face is formed by the edge of end cap 271 which is of similar configuration to cap 71 but with a longer first diameter portion. End cap 271 is attached to electrode 262 by braze 74. The gap G is again enclosed within sleeve 75.

Figure 7:
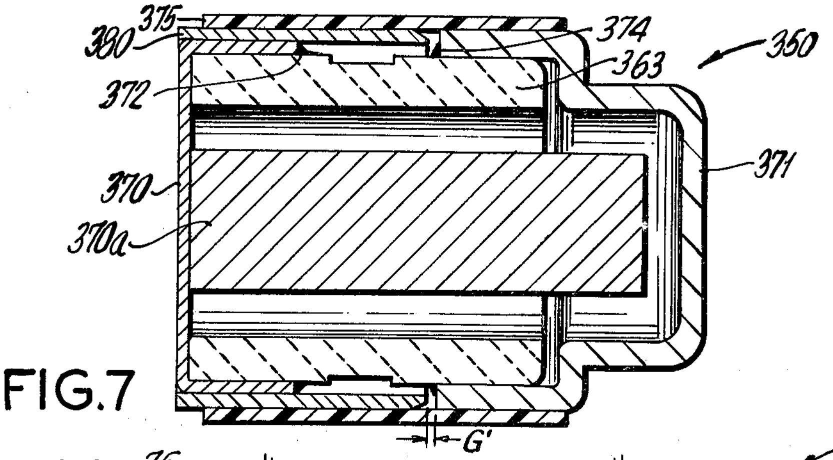
Figure 8:
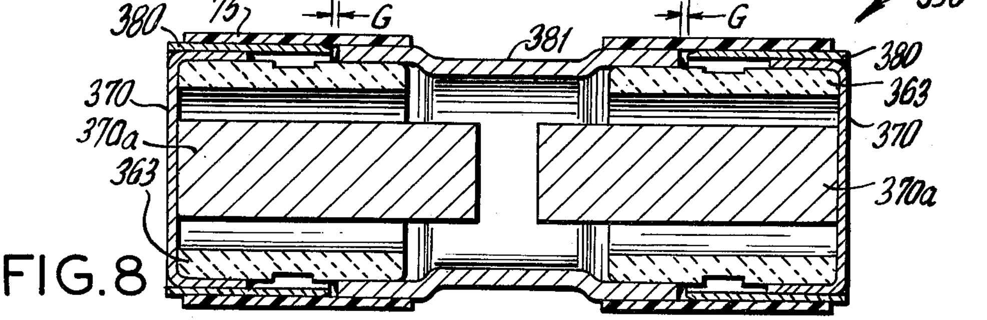
FIG. 8 is a longitudinal, cross-sectional view of a three-electrode gas tube assembly.

FIGS. 7 and 8 show a two electrode and three electrode gas tube arrester 350 and 350', respectively. The three electrode arrester 350' includes many of the components common to the two electrode arrester 350 and they are correspondingly numbered. These arresters differ from the previously described arresters in that the back-up air gap structure is formed with the gas tube.

Each arrester includes a pair of end caps 370 and 371 which are sealed by braze 372 and 374 to a ceramic sleeve 363. Cap 370 is generally cylindrical in shape with a circular end and includes an electrode rod 370*a* extending therefrom coaxially through the sleeve 363 and into special relationship with cap 371.

End cap 371 is a thick walled (about 2X wall thickness of cap 370) and is shaped similar to end cap 71 described above. The main arrester gap is between rod 370*a* and the interior of end cap 371. It will be appreciated that the interior of the arrester is charged with ionizable gas as is well known in the art.

The external or back-up air gap G is formed between the end of cap 371 and a sleeve extension member 380 electrically attached to end cap 370. Member 380 may be bonded as by brazing and the air gap G distance is controlled by sliding the member into contact with a shim as previously described. An insulative sleeve 75, previously described, encloses the gap G and completes the assembly.

The three electrode embodiment 350', FIG. 8, can be seen as a combination of two electrode rods 370*a* with two ceramic sleeves 363 within a cylindrical electrode 381 forming a common gas chamber. The three electrode embodiment functions in a manner well known in the art.

Figure 7A:
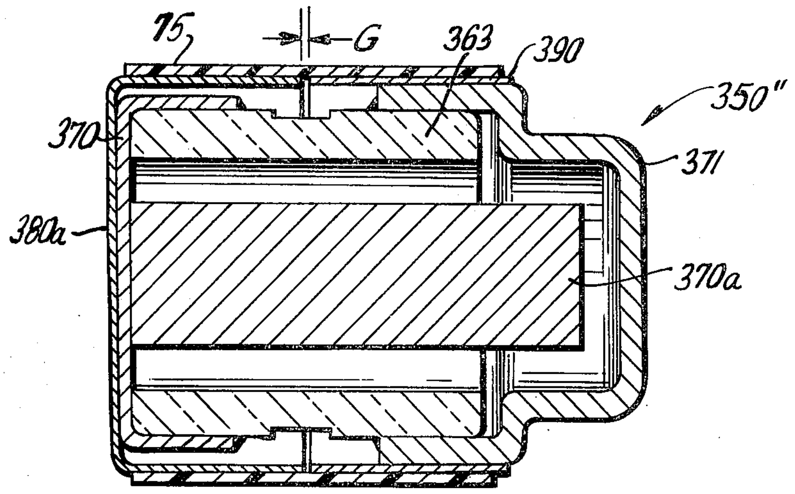

FIG. 7A shows a modified air gap structure for the device of FIG. 7. In arrester 350' the member 380 has a circular bottom 380*a* in addition to the cylindrical side. A separate cylindrical extension 390 is electrically attached, e.g. brazed to end cap 371 and extends toward end cap 380 to form the air gap G. This structure locates the gap remotely from the braze point of end cap 371 to ceramic sleeve 363 and permits independent sizing of the air gap G and the primary gap of the tube arrester.

Figure 9:
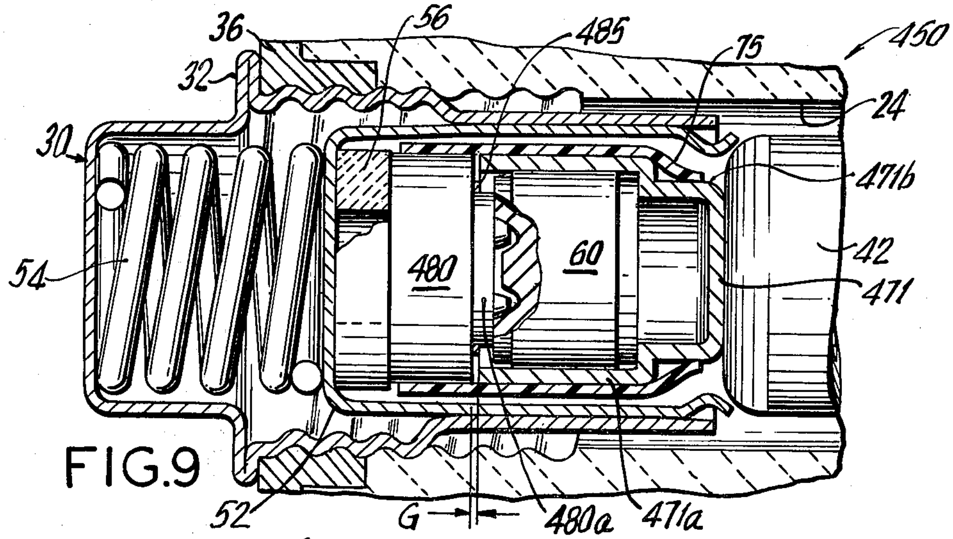
FIGS. 9 and 9A are enlarged partial cross-sectional views of two alternative two electrode gas tube assemblies.
Figure 9A:
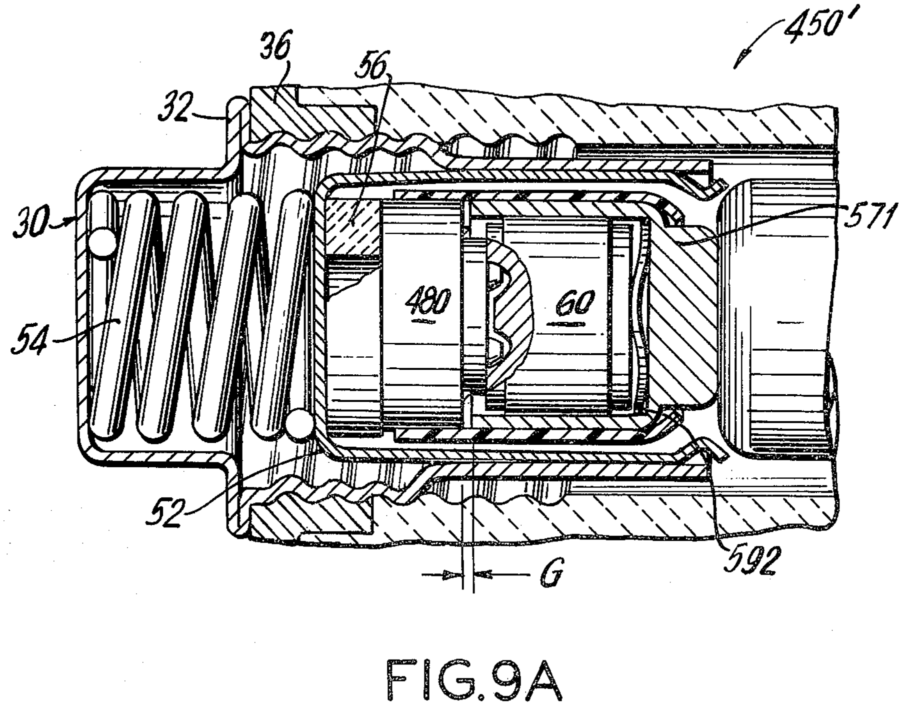

FIGS. 9 and 9A show further arrester assemblies 450 and 450' positioned in a telephone protector base of the type shown in FIGS. 1 and 2. Assembly 450 includes tube 60 positioned in a first end cap 471 having an elongate first diameter portion 471*a* and a reduced diameter portion 471*b*. Tube 60 is received in portion 471*a* and is in electrical contact with the shoulder of the end cap.

Tube 60 is in electrical contact with a contoured spacer 480 which is generally cylindrical in shape with a contoured extension 480*a*. Extension 480*a* has a disc shaped portion and an annular portion. The annular portion fits with the cupped electrode of tube 60 to center the tube with respect to spacer 480. The shoulder between disc shaped portion and the cylindrical portion of spacer 480 includes an insulating washer 485 which separates the metallic spacer 480 from the metallic end cap 471. Cutouts in the washer, e.g., cord shaped, form the back-up air gap G.

A shrink fit sleeve 75 encloses the gap G and holds the assembled components in an easily handled package. An annular solder pellet 56 provides the fail safe short circuiting action previously described.

As an alternative to end cap 471, an end cap 571 of similar shape but with a solid (i.e., no cavity) reduced diameter portion may be utilized to create a heat sink as shown in FIG. 9A. In this embodiment a wave washer 592 may be used between the solid portion and the right hand electrode of arrester 60 to provide resilient electrical contact.

Figure 10:
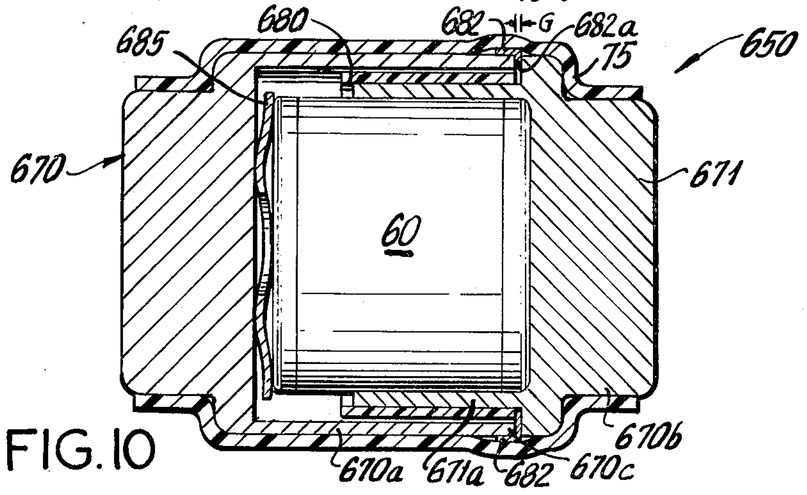
FIG. 10 is a longitudinal, cross-sectional view of a still further alternative embodiment.

FIG. 10 shows another arrester 650 in which both end caps 670 and 671 may have solid ends. Both end caps have first diameter portions 670*a*, 671*a* which are sized to permit the positioning of portion 671*a* within portion 670*a*. An annular insulator 680 is positioned between these portions along their adjacent surfaces. The free end 670*c* of end cap 670 abuts against another insulating space washer 682 to maintain the end caps in spaced relationship. Washer 682 may be generally L-shaped in section with the cylindrical portion lying against the exterior wall of portion 670*a*. The other portions extends radially inwardly.

The air gap G is provided by one or more cut-outs 682*a* in the radially extending portion of washer 682 to permit arcing. The size of the gap G is thus determined by the thickness of the radial part of the washer.

Electrical contact between gas tube 60 and end caps 670 is achieved by a wave-spring washer 685 positioned between the interior of the end cap and the associated end of the gas tube. Wave-spring washer 685 permits adjustment in the relative positioning of the elements and, thus allows control of the size of the air gap by washer 682 when clamped under pressure.

The assembly is enclosed within an insulating sleeve 75 of the type previously described. The completed assembly has an outer configuration similar to that shown in FIG. 3 and is particularly suited for use in the station protector assembly of FIG. 182.

During normal operation of the arrester, transient surges produce ionization in the normal manner to protect the subject equipment. If, however, a sustained surge condition occurs as where a line is permanently contacted by a higher voltage line, the resultant ionization currents flowing through the arrester produce excessive heat; the fusible element 56, placed in the arrester region to respond to this heating, thereby melts. As this occurs, cage fingers 52, and in particular the contact sections 52C thereof, move into contact with button 42. When electrical contact is made a short circuit is established between the button 42 and terminal 36 thus providing a fail-safe (short) action. The breakdown voltage of the gas tube arrester is arranged to be less than that of the air gap described so that the air gap normally will not operate.

The air gap G provides back-up protection in the event of gas tube failure. With this additional provision a failure of the gas tube in the open mode, as for example by reason of a gas leak, does not result in a loss of protection; the air gap, e.g., 3 mils provides back-up protection prior to arrester replacement and strikes at a voltage in range of 500–1000 volts.

These and other embodiments may be made by those skilled in the art without departing from the scope and spirit of the invention. For example, the sleeve 75 may be replaced by adhesive coated tape, e.g., thermo-setting adhesive, or epoxy.

What is claimed is:

1. In a gas tube arrester having two end electrodes and insulating sleeve wherein the improvement comprises back-up air gap means on the exterior of said arrester, said air gap means including electrically conductive end cap means in electrical and operative engagement with one of the gas tube electrodes and extending a predetermined distance over the sleeve toward the other electrode; means associated with said other electrode to form a back-up air gap with said end cap means; and wherein said end cap means includes shoulder means for abutting an end of said one electrode to establish said predetermined distance.

2. The arrester of claim 1, wherein said air gap is about 3 mils.

3. The arrester of claim 1, wherein the strike voltage is in the range of about 500 to 1000 volts.

4. The arrester of claim 1, wherein said end cap means is generally cylindrical in shape.

5. In a gas tube arrester having two end electrodes and insulating sleeve wherein the improvement comprises back-up air gap means on the exterior of said arrester, said air gap means including electrically conductive end cap means in electrical and operative engagement with one of the gas tube electrodes and extending over the sleeve toward the other electrode, said end cap means being generally cylindrical in shape; means associated with said other electrode to form a back-up air gap with said end cap means; insulative sleeve means overlying said cap whereby said external gap is enclosed from the environment; and wherein said generally cylindrical end cap means includes a first diameter portion and a reduced diameter portion.

6. The arrester of claim 5, wherein the means associated with the other electrode is the same shape as the end cap means, said air gap means being defined between the peripheral edges of the opposed first diameter portions.

7. The arrester of claim 5, wherein the means associated with the other electrode is generally cylindrical in shape, said air gap means being defined between the peripheral edges of said end cap means and associated means.

8. The arrester of claim 7, wherein the means associated with said other electrode is an enlarged diameter electrode extending beyond the insulating sleeve of said tube, said gap being defined between the edge of said at least one end cap and the enlarged diameter electrode.

9. A gas tube assembly for use in screwin well type station protectors comprising:

(a) gas filled surge arrester tube having two electrodes and insulating sleeve defining an ionization gap, said gas tube having a configuration adapted to fit in a conductive holder assembly to fit screw-in well type station protectors;

(b) back-up air gap means bridging the external surfaces of said two electrodes, said air gap means including electrically conductive end cap means in electrical and operational engagement with one of the gas tube electrodes and extending over the tube sleeve, said air gap means being a controlled length air gap in an axial direction on said gas tube;

(c) means associated with the other electrode to form an air gap therebetween;

(d) insulative sleeve means overlying said gap, whereby said air gap is enclosed.

10. The assembly of claim 9, wherein said back up air gap means is enclosed by a shrinkable plastic material.

11. A gas tube arrester comprising:

a first end electrode;

a second end electrode;

an insulating sleeve joining said first and said second electrodes;

said first electrode having the form of an end cap for closing off an end of the gas tube of said arrester; said first electrode including a shoulder for butting against an end of said sleeve, and a skirt; said skirt extending from said shoulder and along said sleeve toward said second electrode to form a wall, generally normal to the axis of said gas tube, of a back-up air gap; and means associated with said second electrode to form said back-up air gap with first electrode, said skirt extending a predetermined distance from said shoulder to provide a prescribed width of said back-up air gap.

* * * * *

UNITED STATES PATENT AND TRADEMARK OFFICE

CERTIFICATE OF CORRECTION

PATENT NO. : 4,319,300

DATED : March 9, 1982

INVENTOR(S) : John Napiorkowski and Raymond D. Jones

It is certified that error appears in the above—identified patent and that said Letters Patent is hereby corrected as shown below:

On the first page of the patent in the list of inventors, delete "; Toshitaka Fukushima, Yokohama; Kazumi Koyama, Kanagawa; Kouji Ueno, Kawasaki; Tamio Miyamura, Kawasaki; Yuicha Kawabata, Kawasaki, all of Japan."

On the first page of the patent in the list of assignees, delete"; Fujitsu Limited, Kawasaki, Japan."

In Column 2, line 68, "provide" should read -- provides --.

Signed and Sealed this

*Twenty-fifth* Day of *May 1982*

[SEAL]

*Attest:*

GERALD J. MOSSINGHOFF

*Attesting Officer* *Commissioner of Patents and Trademarks*